(12) United States Patent
Wang et al.

(10) Patent No.: US 11,074,965 B2
(45) Date of Patent: Jul. 27, 2021

(54) MEMORY DEVICE

(71) Applicant: FUJIAN JINHUA INTEGRATED CIRCUIT CO., LTD., Fujian (CN)

(72) Inventors: Jianfang Wang, Fujian (CN); Peng Guo, Fujian (CN); Baoyu Li, Fujian (CN); Yuanbao Wang, Fujian (CN)

(73) Assignee: Fujian Jinhua Integrated Circuit Co., Ltd., Quanzhou (CN)

( * ) Notice: Subject to any disclaimer, the term of this patent is extended or adjusted under 35 U.S.C. 154(b) by 0 days.

(21) Appl. No.: 16/635,197

(22) PCT Filed: Dec. 11, 2019

(86) PCT No.: PCT/CN2019/124586
§ 371 (c)(1),
(2) Date: Jan. 30, 2020

(87) PCT Pub. No.: WO2020/151389
PCT Pub. Date: Jul. 30, 2020

(65) Prior Publication Data
US 2021/0027832 A1    Jan. 28, 2021

(30) Foreign Application Priority Data

Jul. 22, 2019    (CN) .......................... 201910662928.9

(51) Int. Cl.
*G11C 11/24*      (2006.01)
*G11C 11/4097*   (2006.01)
*H01L 27/108*    (2006.01)

(52) U.S. Cl.
CPC ........ *G11C 11/4097* (2013.01); *H01L 27/108* (2013.01)

(58) Field of Classification Search
CPC .......................... G11C 11/4097; H01L 27/108
USPC .................................................. 365/149, 51
See application file for complete search history.

(56) References Cited

U.S. PATENT DOCUMENTS

| | | | | |
|---|---|---|---|---|
| 6,734,059 | B1 * | 5/2004 | Hummler | H01L 27/10841 257/E21.396 |
| 8,659,111 | B2 * | 2/2014 | Kim | H01L 21/76879 257/499 |
| 9,379,002 | B2 * | 6/2016 | Han | H01L 23/535 |
| 9,818,795 | B2 * | 11/2017 | Debord | H01L 21/823878 |
| 9,893,071 | B2 * | 2/2018 | Kim | H01L 21/76883 |
| 10,056,288 | B1 * | 8/2018 | Lu | H01L 29/4236 |

(Continued)

FOREIGN PATENT DOCUMENTS

| | | |
|---|---|---|
| CN | 107240586 A | 10/2017 |
| CN | 207489874 U | 6/2018 |
| CN | 108766969 A | 11/2018 |

*Primary Examiner* — Viet Q Nguyen
(74) *Attorney, Agent, or Firm* — Winston Hsu

(57) ABSTRACT

A memory device is disclosed, in which node contacts extend into a substrate, where they are come into electrical connection with active areas. This allows greater contact areas between the node contacts and the active areas and electrical connection of the node contacts with high ion concentration portions of the active areas. As a result, even when voids are formed in the node contacts, the node contacts can still possess desired connection performance. For node contacts allowed to contain voids, this enables them to be fabricated faster with lower difficulty, thus increasing manufacturing throughput of the memory device.

17 Claims, 5 Drawing Sheets

(56) References Cited

U.S. PATENT DOCUMENTS

| | | | | |
|---|---|---|---|---|
| 10,151,048 B1* | 12/2018 | Wu | .................... | H01L 21/02293 |
| 10,347,640 B1* | 7/2019 | Tsai | .................. | H01L 27/10805 |
| 10,453,677 B2* | 10/2019 | Huang | .............. | H01L 27/10894 |
| 10,559,571 B2* | 2/2020 | Kim | .................. | H01L 21/76814 |
| 10,608,093 B2* | 3/2020 | Wu | ....................... | H01L 27/108 |
| 2005/0003307 A1* | 1/2005 | Kuan | ................ | H01L 21/76897 |
| | | | | 430/313 |
| 2007/0161183 A1 | 7/2007 | Hwang | | |
| 2012/0098141 A1* | 4/2012 | Kim | .................. | H01L 21/26506 |
| | | | | 257/774 |
| 2012/0153456 A1* | 6/2012 | Kim | .................. | H01L 21/76897 |
| | | | | 257/734 |
| 2015/0364479 A1* | 12/2015 | Inokuma | ............. | H01L 27/1157 |
| | | | | 257/401 |
| 2018/0301459 A1* | 10/2018 | Kim | ..................... | B08B 7/0014 |

* cited by examiner

MEMORY DEVICE

TECHNICAL FIELD

The present invention relates to the field of semiconductor technology and, in particular, to a memory device.

BACKGROUND

A memory device, such as a dynamic random access memory (DRAM) device, typically includes storage capacitors and storage transistors electrically connected to the storage capacitors. The storage capacitors are adapted to hold charges representative of information stored thereon, and the storage transistors may be electrically coupled to the storage capacitors via node contacts.

In the state of the art, the existing memory devices are still faced with a number of challenges including difficult and tedious fabrication. For example, in order to form a node contact ensured to be electrically connected with good quality to a storage transistor, the processes used must meet very stringent requirements, such as a deposition process with good filling performance. These strict requirements inevitably slow down the node contact's fabrication, leading to a low manufacturing throughput and low utilization of the involved semiconductor processing equipment.

SUMMARY OF THE INVENTION

It is an objective of the present invention to provide a memory device which can be fabricated in an easier and faster manner, thus helping in increasing manufacturing throughput thereof.

To this end, the provided memory device includes:
  a substrate in which a plurality of active areas are formed;
  a plurality of bit-line structures formed on the substrate, adjacent ones of the plurality of bit-line structures defining therebetween node contact windows, each of the node contact windows having a lower portion extending into the substrate and exposing at least part of a corresponding one of the plurality of active areas; and
  a plurality of node contacts filled in the respective node contact windows and electrically connected to the plurality of active areas, wherein at least one void is formed in the plurality of node contacts, the at least one void having a top not lower than a bottom of any adjacent one of the plurality of bit-line structures.

In this memory device, the node contacts can be embedded in the substrate and therein come into electrical connection with the active areas. This can, on the one hand, result in greater contact areas between the node contacts and the active areas, and on the other hand, bring the node contacts into contact with high ion concentration portions of the active areas. As a result, contact resistances between the node contacts and the active areas can be improved. Consequently, the memory device allows formation of voids in the node contacts, which in turn allows the node contacts to be fabricated faster using a rapid deposition process, thereby speeding up the fabrication of the memory device, efficiently increasing its manufacturing throughput and enhancing the utilization of the used semiconductor processing equipment. In other words, for the memory device of the invention, even when the node contacts contain voids, electrical connection between the node contacts and the active areas can be efficiently compensated for by embedding the node contacts in the substrate, thus ensuring good electrical conductance quality of the node contacts. This can result in an additional increase in manufacturing throughput of the memory device.

Further, the lower portions of the node contact windows defined by the bit-line structures extend in the substrate so that their bottoms are located below a top surface of the substrate. Additionally, since the top of each of the voids in the node contacts is located not lower than the bottom of any adjacent one of the bit-line structures (e.g., the voids in the node contacts each have a portion above the top surface of the substrate), it can be ensured that the connection quality of the node contacts with the active areas will not be affected due to closeness of the voids to the active areas.

Furthermore, the lower portions of the node contact windows that extend in the substrate may, for example, include respective first grooves formed in trench isolation structures and respective second grooves formed in the active areas and located deeper than the first grooves. In this way, even larger areas of the active areas can be exposed in the node contact windows, resulting in accordingly increased contact areas between the node contacts and the active areas.

100 Substrate
101 First Source/Drain Region
102 Second Source/Drain Region
110 Trench Isolation Structure
200a Node Contact Window
200 Node Contact
200G Void
210G First Void
220G Second Void
300 Bit-Line Structure
300a Recess
310 Bit Line
311 First Conductive Layer
312 Second Conductive Layer
313 Third Conductive Layer
320 Masking Layer
330 Spacer
331 First Isolation Layer
332 Second Isolation Layer
333 Third Isolation Layer
400 Spaced Insulation Line
AA Active Area

DETAILED DESCRIPTION

Specific embodiments of the memory device proposed in this invention will be described in greater detail below with reference to the accompanying drawings. Features and advantages of the invention will be more apparent from the following detailed description. Note that the accompanying drawings are provided in a very simplified form not necessarily presented to scale, with their only intention to facilitate convenience and clarity in explaining the embodiments.

Figure 1:
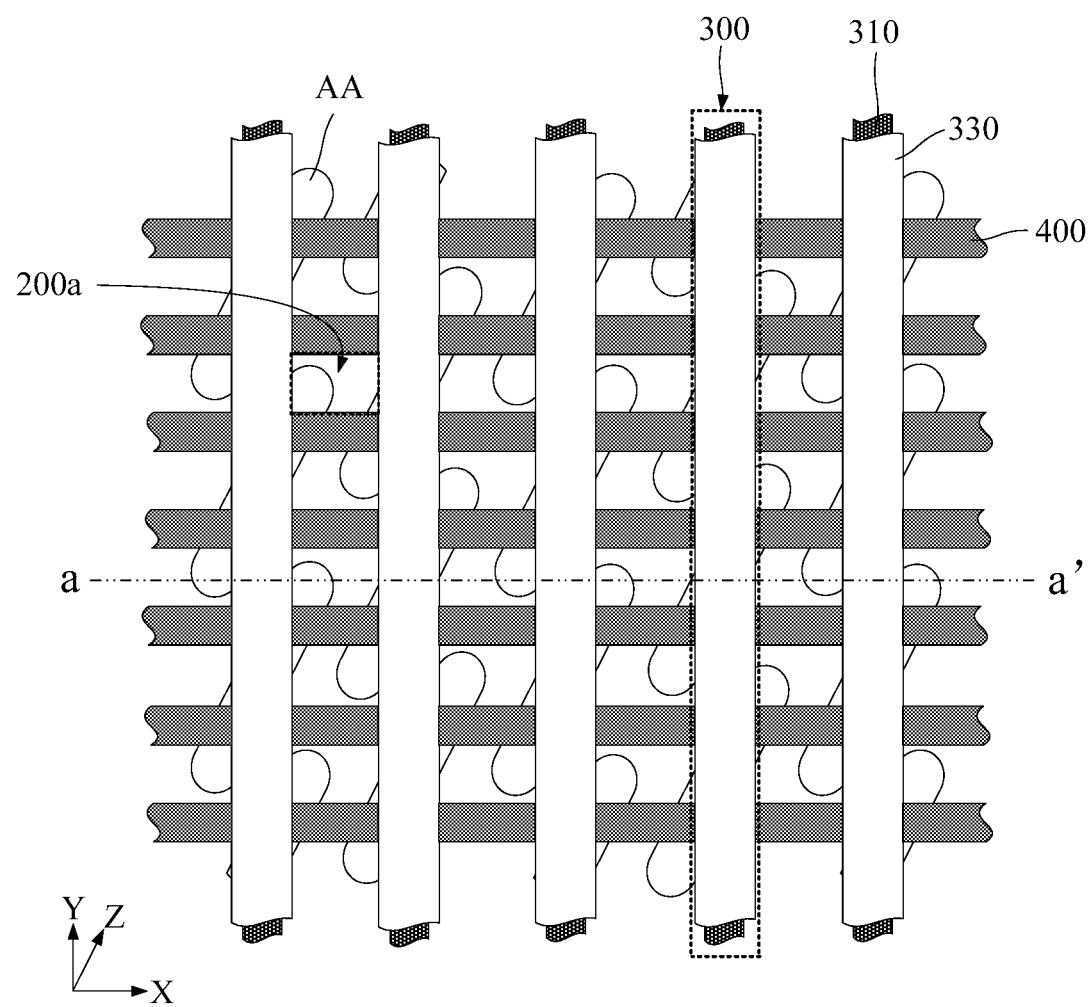
FIG. 1 is a top view of a memory device according to an embodiment of the present invention.
Figure 2:
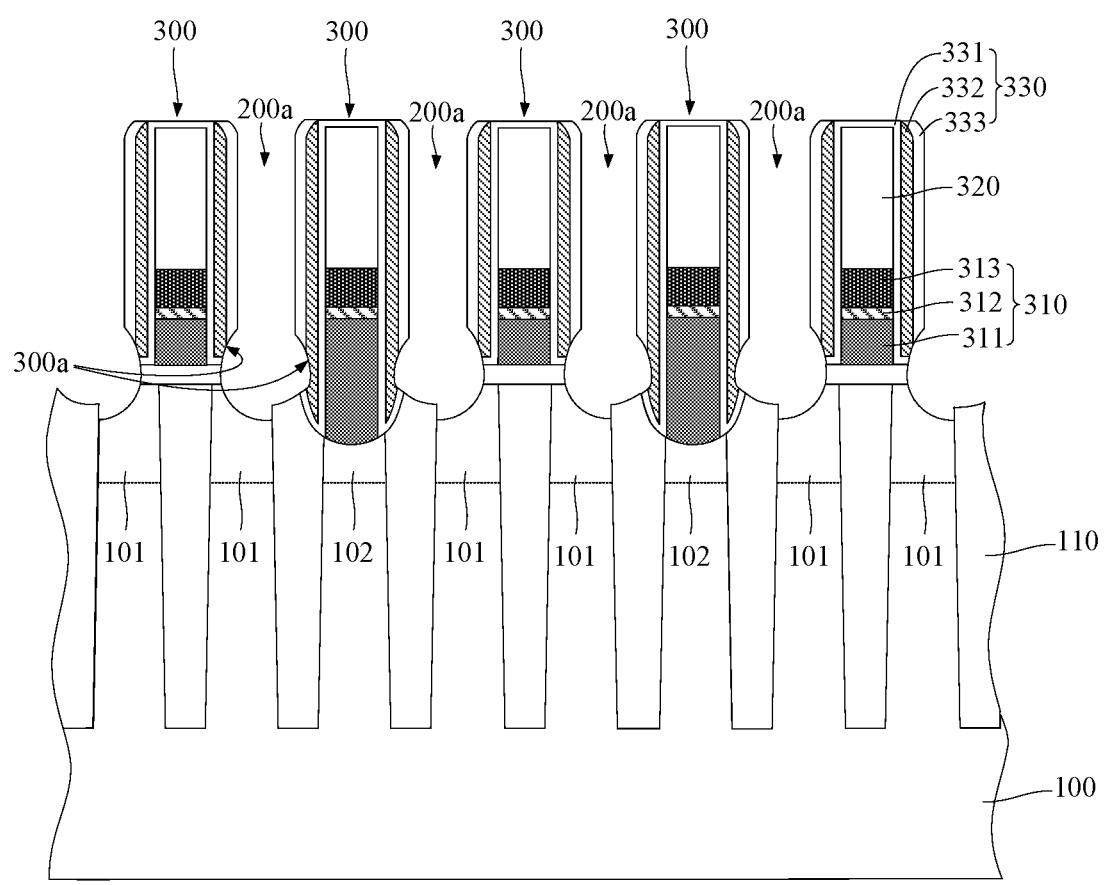
FIG. 2 is a schematic cross-sectional view of a memory device according to an embodiment of the invention taken along line aa', in which node contacts are not shown.
Figure 3:
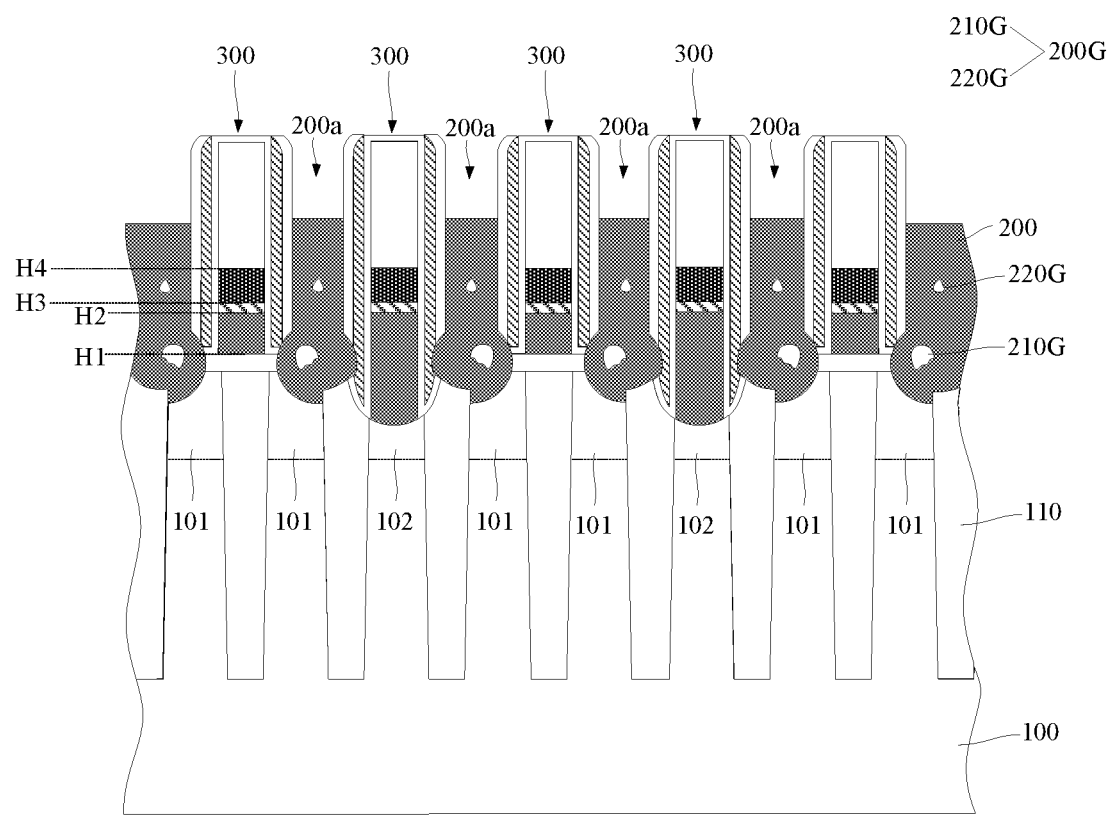
FIG. 3 is a schematic cross-sectional view of a memory device according to an embodiment of the invention taken along line aa'.

FIG. 1 is a top view of a memory device according to an embodiment of the present invention. FIG. 2 is a schematic cross-sectional view of a memory device according to an embodiment of the invention taken along line aa', in which node contacts are not shown. FIG. 3 is a schematic cross-sectional view of a memory device according to an embodiment of the invention taken along line aa'. It is noted that, for the sake of a clearer understanding of the invention, some components are not shown in the top view of FIG. 1, including word lines and node contacts.

With combined reference to FIGS. 1 to 3, the memory device includes a substrate 100 and, formed on the substrate 100, bit-line structures 300 and node contacts 200.

Specifically, in the substrate 100, there are formed a plurality of active areas AA, in which first source/drain regions 101 and second source/drain regions 102 are formed to constitute storage transistors. Every two adjacent ones of the active areas AA may be isolated from each other, for example, by a trench isolation structure 110.

Additionally, a plurality of word lines WL (not shown) may be formed in the substrate 100, which extend in a first direction (X direction) and cross the respective active areas AA. The portions of the word lines WL where they cross the active areas AA are located between the first source/drain regions 101 and the second source/drain regions 102 and form gate structures of the storage transistors.

With continued reference to FIGS. 1 to 3, in the memory device, the plurality of bit-line structures 300 are formed on the substrate 100. The bit-line structures 300 may extend in a second direction (Y direction) and intersect the respective active areas AA, with their portions where they cross the active areas AA forming, for example, bit line contacts electrically connected to the active areas AA. According to this embodiment, the bit line contacts may be electrically connected to the second source/drain regions 102 in the active areas AA.

It would be appreciated that each of the bit-line structures 300 has one of the bit line contacts and a bit-line junction that connects two corresponding adjacent ones of the bit line contacts and is situated on a top surface of the substrate 100.

With particular reference to FIG. 1, according to this embodiment, between every two adjacent ones of the bit-line structures 300, there is at least one first source/drain region 101. Based on this, every two adjacent ones of the bit-line structures 300 define a node contact window 200a. It can be considered that the opposing side walls between two adjacent ones of the bit-line structures 300 are also used to provide respective side walls of the node contact window 200a.

It will be appreciated that when the bit-line structures 300 extend in the second direction (Y direction), every two adjacent ones of the bit-line structures 300 provide the node contact window 200a defined by them with respective side walls that oppose each other along the first direction (X direction).

With continued reference to FIG. 1, for example, on the surface of the substrate 100, there may be formed spaced insulation lines 400 extend in the first direction (X direction). The spaced insulation lines 400 cross the bit-line structures 300, thus defining a lattice of openings corresponding to the respective node contact windows 200a. In addition, in the second direction, every two adjacent ones of the spaced insulation lines 400 provide each of those of the node contact windows 200a located therebetween with respective side walls opposing each other in the second direction (Y direction). In other words, according to this embodiment, the bit-line structures 300 and the spaced insulation lines 400 together define the node contact windows 200a.

With particular reference to FIGS. 2 and 3, each of the node contact windows 200a has a bottom located within the substrate 100 so that a large part of the underlying active area AA is exposed in the node contact window 200a (i.e., at least part of the active area AA is exposed in the node contact window 200a). In other words, the bottom of the node contact window 200a is lower than the top surface of the substrate. This can facilitate electrical connection of the node contact 200 filled in the node contact window with the active area AA. According to this embodiment, a corresponding one of the first source/drain regions 101 in the active areas AA is exposed in the node contact window 200a.

As such, the node contact 200 is filled in the node contact window 200a, and a bottom portion of the node contact 200 extends within the substrate 100 and comes into electrical connection with the active area AA. According to this embodiment, the bottom portion of the node contact 200 is electrically connected to the first source/drain region 101 in the active areas AA. Furthermore, for example, a top portion of the node contact 200 is adapted to connect a storage capacitor (not shown).

With particular reference to FIG. 3, at least one void 200G is formed in the node contact 200. According to this embodiment, the void 200G in the node contact 200 has a top located not lower than (higher than) the bottom of any adjacent one of the bit-line structures 300 so that, for example, the void 200G in the node contact 200 has a portion that is located higher than the top surface of the substrate. In this way, the void 200G in the node contact 200 is distant from the active area AA, avoiding a reduction in connection quality between the node contact 200 and the active area AA that may arise when the void 200G is located too close to the active area AA.

Of course, it is also possible that the bottom of the void 200G in the node contact 200 is lower than the top surface of the substrate 100, as long as it is ensured that the void 200G in the node contact 200 does not extend to an inner wall of the node contact window 200a.

It is to be noted that, according to this embodiment, despite the void 200G formed within the node contact 200, an enlarged contact area can be ensured between the node contact 200 and the active area AA since the node contact 200 is embedded in the substrate 100. Moreover, since the active area AA is typically implanted with ions in such a manner that a portion thereof deeper in the substrate has a higher ion concentration than a portion thereof close to the substrate surface, the extension of the node contact 200 within the substrate 100 allows the node contact 200 to be electrically connected to a portion of the active area AA with a higher ion concentration. As a result, a lower contact resistance can be obtained between the node contact 200 and the active area AA.

The greater contact area between the node contact 200 and the active area AA and the electrical connection of the node contact 200 with a higher ion concentration portion of the active area AA impart improved connection quality between the node contact 200 and the active area AA. For this reason, the performance of the node contact 200 will not be considerably affected by the presence of the void 200G formed in the node contact portion 200.

It is to be also noted that since the presence of the void 200G is allowed in the node contact 200, the node contact 200 may be formed faster using a rapid deposition process, which can increase the speed and throughput of the fabrication of the memory device as well as the utilization rate of the involved semiconductor processing equipment.

With continued reference to FIGS. 2 and 3, the bit line contacts at which the bit-line structures 300 cross the active areas AA may be each embedded in the substrate 100, the bottoms of the bit line contacts are lower than the top surface of the substrate. This can ensure sufficient contact between the bit line contacts in the bit-line structures 300 and the second source/drain regions 102, thereby reducing the contact resistances between the bit line contacts in the bit-line structures 300 and the second source/drain regions 102.

Further, according to this embodiment, the bottoms of the bit line contacts in the bit-line structure 300, which are located within the substrate 100, are lower than the bottoms of the node contacts 200, which are also located within the substrate 100.

Specifically, bit line contact windows for accommodating the bit line contacts may be formed in the substrate 100. The bit line contact windows may have bottoms, which are located at a predetermined depth of the substrate 100 and from which the second source/drain regions 102 in the active areas AA are exposed. Additionally, the bit line contacts in the bit-line structures 300 may fill up the bit line contact windows so as to come electrical connection with the second source/drain regions 102. Accordingly, the bottoms of the bit line contact windows may be located lower than the bottoms of the node contact windows 200a.

With particular reference to FIG. 3, the at least one void 200G in each of the node contacts 200 may include a first void 210G The first void 210G is located close to the bottoms of two corresponding adjacent ones of the bit-line structures 300 and the first void 210G has a top situated between aligned portions of these two corresponding adjacent bit-line structures 300. Likewise, the top of the first void 210G may be located not lower than the bottom of any one of the adjacent bit-line structures 300.

Specifically, the aligned portions of the adjacent bit-line structures 300 refer generally to the portions of the bit-line structures 300 that are higher than the top surface of the substrate. For example, the node contact window 200a between the adjacent bit-line structures 300 is defined by a portion of one of the bit-line structures corresponding to its bit-line junction (formed on the top surface of the substrate) and a portion of the other of the bit-line structures corresponding to its bit line contact (embedded in the substrate). Therefore, the aligned portion of each of the adjacent bit-line structures 300 corresponds to its portion extending from the bottom of its bit-line junction to its top.

According to this embodiment, the bottoms of the bit-line junctions are located at a first height H1. Therefore, the aligned portions of the adjacent bit-line structures 300 both have a lower boundary corresponding to the first height H1, and the top of the first void 210G is located above the first height H1. According to this embodiment, the first void 210G may also has a bottom that is located below the first height H1.

With continued reference to FIGS. 2 and 3, the bit-line structures 300 may include bit lines 310. The bit lines 310 are formed on the substrate 100 and electrically connected to the active areas AA.

Specifically, each of the bit lines 310 may include a first conductive layer 311, a second conductive layer 312 and a third conductive layer 313, which are stacked one on another. Materials from which the first conductive layer 311 can be fabricated may include, for example, doped polysilicon. Materials from which the second conductive layer 312 can be fabricated may include, for example, titanium nitride. Materials from which the third conductive layer 313 can be fabricated may include, for example, tungsten. According to this embodiment, the first conductive layer 311 in the bit-line junction of the bit-line structure 300 may have a bottom located at the first height H1, and the aligned portions of the adjacent bit-line structures 300, between which the top of the first void 210G is located, may correspond to the first conductive layers 311 in the bit-line structure 300.

With continued reference to FIG. 2, recesses 300a may further be formed in outer side surfaces of lower sections of the bit-line structures 300, and the recesses 300a may be lateral open into voids between adjacent ones of the bit-line structures 300. It would be appreciated that, according to this embodiment, the recesses 300a formed in the lower portions of the bit-line structures 300 can laterally expand the lower sections of said voids and hence the respective node contacts 200 fill in the recesses 300a, the lower portions of the node contacts 200 are also provided with larger size to increase contact areas with the active areas AA.

Further, the recesses 300a in the void between every two adjacent ones of the bit-line structures 300 may be aligned with each other. Furthermore, according to this embodiment, the aligned portions of the adjacent bit-line structures 300, between which the top of the first void 210G in the node contacts 200 is located, may correspond to the recesses 300a.

With continued reference to FIG. 2, according to this embodiment, grooves may be formed in the substrate between every two adjacent ones of the bit-line structures 300 in such a manner that they open into the void between the two specific bit-line structures 300. It would be appreciated that the grooves formed in the substrate 100 constitutes part of the portion of the node contact window 200a defined between the bit-line structures 300, which extends within the substrate 100, and a corresponding one of the first source/drain regions 101 is exposed in the grooves. Additionally, according to this embodiment, lower boundaries of the recesses 300a in the respective bit-line structures 300 may merge with respective boundaries of the respective grooves so that they together define a large first opening in the bit line contact window 200a. Specifically, internal surfaces of the recesses 300a may smoothly continue with respective internal surfaces of the respective grooves.

With particular reference to FIG. 2, adjacent ones of the active areas AA may be mutually isolated by the trench isolation structures 110 formed in the substrate 100. In addition, in each of the node contact windows 200a, at least part of a corresponding one of the active areas (i.e., a corresponding one of the first source/drain regions 101) and at least part of a corresponding one of the trench isolation structures 110 may be both exposed.

According to this embodiment, grooves may be formed in the substrate 100, including first grooves in the trench isolation structures 110 and second grooves in the active areas AA. Additionally, bottoms of the second grooves may be located lower than the bottoms of the first grooves. In this way, the second grooves allow the exposure of greater areas of the active areas (i.e., of the first source/drain regions 101) and extension of the node contacts to high ion concentration portions of the active areas.

On basis of the above, according to this embodiment, the lower boundaries of the recesses 300a formed in the lower sections of the bit-line structures 300 may merge with respective adjacent boundaries of the first and second grooves so that they together define the first openings in the bit line contact windows 200*a*.

As discussed above, in each of the bit-line structures 300, the bottom of the bit line contact is lower than the bottoms of the bit-line junction since the bit-line junction connecting the adjacent bit line contacts resides on the top surface of the substrate 100, with the bit line contact being embedded in the substrate 100. Therefore, the bottom of the recess 300*a* in the bit-line junction stops at the top surface of the substrate 100, and the recess 300*a* in the bit-line junction is smoothly with the respective adjacent groove in the substrate 100 at the top surface of the substrate. The bottom of the recess 300*a* in the bit-line junction is lower than the top surface of the substrate, and the recess 300*a* in the bit-line junction is smoothly connected with the respective adjacent groove in the substrate 100 within the substrate.

Further, since the bit-line junction in the bit-line structure 300 is situated above the trench isolation structure 110 with its later sides aligned with the active areas AA (i.e., first source/drain regions 101), the recess 300*a* in the bit-line junction is joined to the second groove in the active area. Moreover, since the bit line contact in the bit-line structure 300 is formed on the active area (i.e., the second source/drain region 102) and laterally extends into the corresponding trench isolation structure 110, the recess 300*a* in the bit-line junction is joined to the first groove in the trench isolation structure 110.

With continued reference to FIGS. 2 and 3, according to this embodiment, the first void 210G in the corresponding node contact 200 is formed just in the first opening, the top of the first void 210G is located between the aligned portions of the two adjacent bit-line structures 300 that correspond to the recesses 300*a*. Thus, the top of the first void 210G is located not lower than the lower boundaries of the recesses 300*a* in the bit-line structures 300.

It is a matter of course that, in alternative embodiments, the first void 210G may extend downward so that its bottom is located within one of the grooves in the substrate 100, i.e., the bottom the first void 210G is below the top surface of the substrate 100.

With continued reference to FIG. 3, the first void 210G may be located between two adjacent bit-line structures 300, and the first void 210G is closer to one of the two adjacent bit-line structures than the other. That is, the first void 210G is closer to the one of the two adjacent bit-line structures 300 and may not be located in the middle between the two adjacent bit-line structures 300.

More specifically, according to this embodiment, the location of the second groove in the active area AA may be deeper than that of the first groove in the trench isolation structure 110. Thus, a vertical centerline of the first void 210G is closer to the second groove than the first groove.

With continued reference to FIG. 3, in each of the node contacts 200, a second void 220G may be further formed. The second void 220G has a top and a bottom, both located between the aligned portions of the two corresponding adjacent ones of the bit-line structures 300, and the second void 220G is located in the middle between the two corresponding adjacent bit-line structures 300.

It is to be noted that the aligned portions of the adjacent bit-line structures 300 refer to their portions above the top surface of the substrate, i.e., the portions of the adjacent bit-line structures 300 higher than the first height H1. In other words, the second void 220G, as a whole, is located higher than the first height H1.

According to this embodiment, the second void 220G is specifically located in the aligned portions of the adjacent bit-line structures 300 corresponding to their third conductive layers 313. More specifically, bottoms of the third conductive layers 313 are located at a third height H3, and tops of the third conductive layers 313 are situated at a fourth height H4, the second void 220G may be located at a height from the third height H3 to the fourth height H4.

It is to be noted that, according to this embodiment, in addition to the first openings in the bit line contact windows 200*a*, which are defined by the recesses 300*a* in the lower sections of the bit-line structures 300 together with the grooves in the substrate 100, smaller second openings may be defined also in the bit line contact windows 200*a* by the portions of the bit-line structures 300 above the recesses 300*a*. That is, the portions of the bit-line structures 300 above the recesses 300*a* are configured to define the second openings.

It would be appreciated that, according to this embodiment, each of the node contact windows 200*a* may have a first opening and a second opening, which are one above another and communicate with each other. The first opening is defined by both the recesses 300*a* in the respective adjacent bit-line structures 300 and the grooves in the substrate 100 between the bit-line structures 300 and thus has its bottom located within the substrate 100 and its top above the top surface of the substrate 100. The second opening is joined to the top of the first opening and aligned with portions of the bit-line structures 300 above the recesses 300*a*.

Accordingly, the first opening has a maximum opening size that is greater than that of the second opening. That is, in this embodiment, each of the node contact windows 200*a* has a structure that is narrower at the top and broader at the bottom. Since the first opening extends into the substrate 100 and has a greater opening size, a greater area of the active area AA is exposed in the node contact window 200*a*, enabling a greater contact area between the node contact 200 and the active area AA.

According to this embodiment, the second void 220G may be formed in the second opening and the first void 210G may have a maximum width over two times greater than that of the second void 220G.

With continued reference to FIG. 2, each of the bit-line structures 300 may further include a masking layer 320 and a spacer 330. The masking layer 320 may overlie the bit line 310 and cover the bit line 310, and the spacer 330 may cover at least both side surfaces of the bit line 310 and side surfaces of the masking layer 320.

As discussed above, the bit line contacts in the bit-line structures 300 fill up the respective bit line contact windows. Thus, according to this embodiment, a width of the bit lines 310 in the bit line contacts in the direction in which the bit-line structures extend may be smaller than the opening size of the bit line contact windows so that bit lines 310 are separated from side surfaces of the bit line contact windows. Based on this, the gaps between the bit lines 310 and the bit line contact windows can be further filled by the spacers 330.

According to this embodiment, the recesses 300*a* in the lower sections of the bit-line structures 300 may be formed in the spacers 330. Specifically, the recesses 300*a* may laterally extend from the outer surfaces of the spacers 330 toward the bit lines and stop within the spacers 300 in order to avoid exposure of the bit lines 310.

Each of the spacers 330 may include a stack of layers. For example, according to this embodiment, each of the spacer 330 may include, stacked from the bit line 310 outward, a first isolation layer 331, a second isolation layer 332 and a third isolation layer 333. The first isolation layers 331 may fit over the outer side surfaces of the bit lines 310 and extend into the bit line contact windows to also cover inner side surfaces thereof. The second isolation layers 332 may reside on the respective first isolation layers 331 and fill up the gaps between the bit lines 310 and the bit line contact windows. The third isolation layers 333 may cover the respective second isolation layers 332.

It is to be noted that the first, second and third isolation layers 331, 332, 333 may be either made of the same material or different materials. According to this embodiment, the first and third isolation layers 331, 333 are, for example, silica layers and the second isolation layers 332 are, for example, silicon nitride layer so that each of the spacers 330 is an O-N-O structure.

On the basis of the above, according to this embodiment, in particular, the recesses 300a in the bit-line structures 300 may extend from the third isolation layers 333 toward the second isolation layers 332 and stop in the second isolation layers 332, and the upper boundaries of the recesses 300a in the bit-line structures 300 may be located not higher than tops of the first conductive layers 311.

In the embodiment shown in FIG. 3, the tops of the first voids 210G in the node contacts 200 are located higher than the first height H1, while their bottoms are lower than the first height H1.

However, in other embodiments, the tops and bottoms of the first voids in the node contacts 200 may be both located between the aligned portions of the bit-line structures 300.

Figure 4:
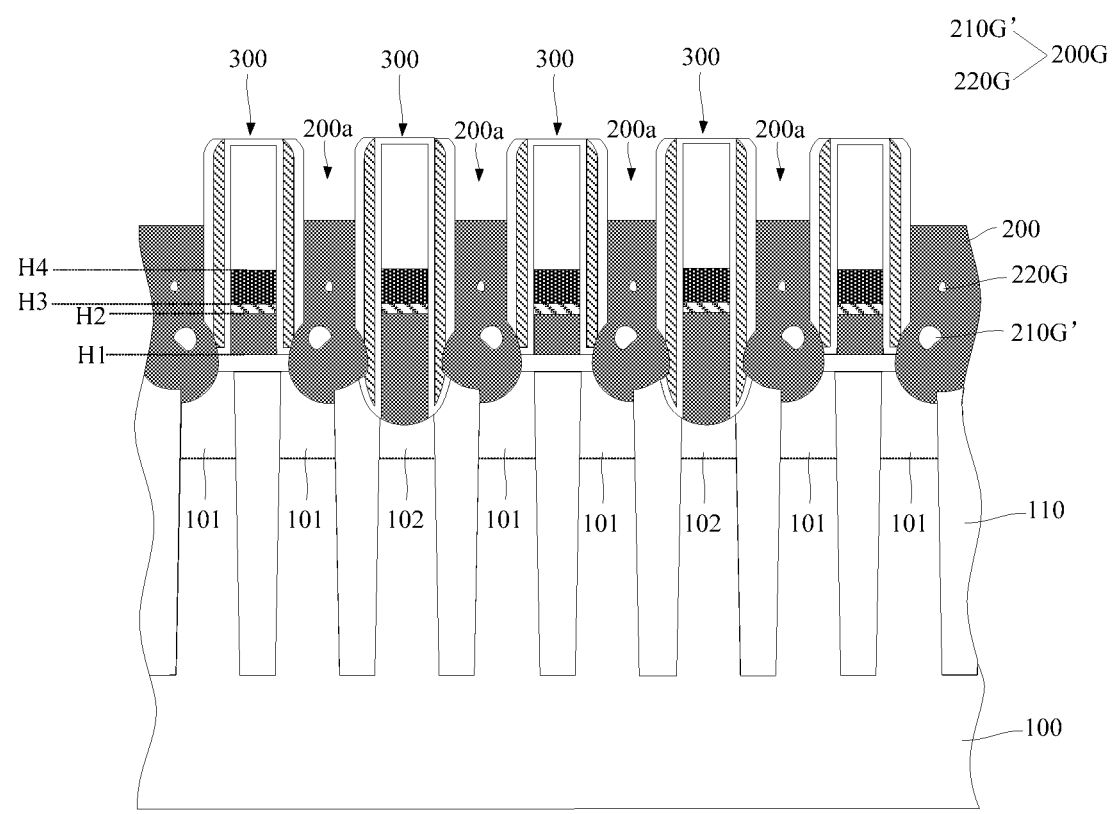
FIG. 4 is a schematic cross-sectional view of a memory device of a different structure according to an embodiment of the invention.

For example, as shown in FIG. 4, the tops and bottoms of the first voids 210G' in FIG. 4 are both located above the first height H1. Additionally, the first voids 210G' in FIG. 4 are formed in spaces between aligned portions of the bit-line structures 300, which correspond to the first conductive layers 311. More specifically, in spaces between aligned portions of the bit-line structures 300, bottoms of the first conductive layers 311 above the top surface of the substrate are located at a first height H1, and tops of the first conductive layers 311 are located at a second height H2, the first voids 210G' are formed at a height from the first height H1 to the second height H2.

Figure 5:
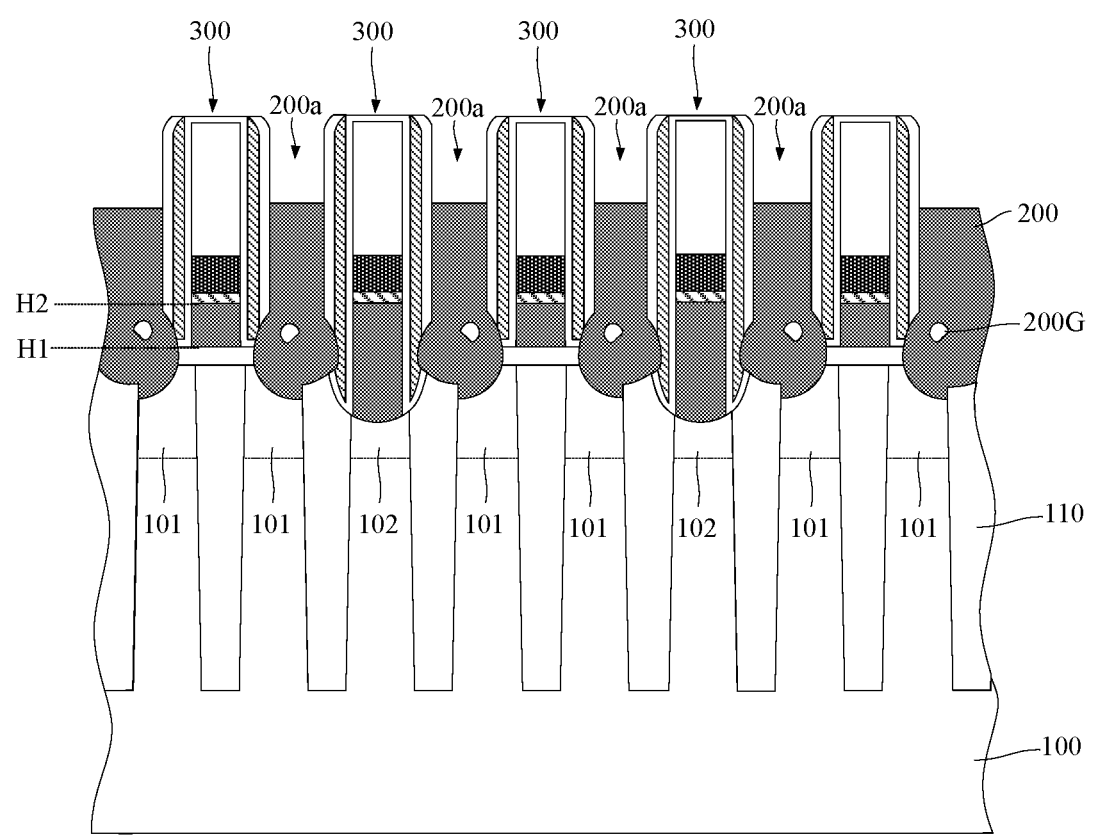
FIG. 5 is a schematic cross-sectional view of a memory device of another different structure according to an embodiment of the invention.

Further, in alternative embodiments, each of the node contacts 200 may contain only one void 200G For example, as schematically shown in FIG. 5, a single void 200G is formed in each of the node contacts 200 and is located between aligned portions of two corresponding adjacent ones of the bit-line structures, which correspond to the respective first conductive layers 311 in these bit-line structures.

In summary, in the memory device according to this embodiment, the node contacts extend into the substrate, where they are come into electrical connection with the active areas. This allows greater contact areas between the node contacts and the active areas and electrical connection of the node contacts with high ion concentration portions of the active areas and is thus helpful in improving connection performance of the node contacts. As a result, even when voids are formed in the node contacts, they can still possess desired performance. For node contacts allowed to contain voids, this allows them to be fabricated with lower difficulty at a higher speed, thus increasing manufacturing throughput of the memory device as well as the utilization rate of the used semiconductor processing equipment.

It is noted that while the invention has been described with reference to several preferred embodiments, it is not intended to be limited to these embodiments in any way. In light of the above teachings, any person of skill in the art may make various possible variations and changes to the subject matter of the present invention or modify it to equivalent alternatives without departing from the scope of the invention. Accordingly, any and all such simple variations, equivalent alternatives and modifications made without departing from the scope of the invention are intended to fall within this scope.

What is claimed is:

1. A memory device, comprising:
   a substrate in which a plurality of active areas are formed;
   a plurality of bit-line structures formed on the substrate, adjacent bit-line structures defining therebetween node contact windows, each of the node contact windows having a lower portion extending into the substrate and exposing at least part of a corresponding one of the plurality of active areas; and
   a plurality of node contacts filled in the respective node contact windows and electrically connected to the plurality of active areas, wherein at least one void is formed in the plurality of node contacts, the at least one void having a top not lower than a bottom of any adjacent one of the plurality of bit-line structures;
   wherein the at least one void comprises a first void, each of the plurality of bit-line structures comprising a first conductive layer, a second conductive layer and a third conductive layer sequentially formed on the substrate, and wherein a top of the first void is located between aligned portions of the first conductive layers of the adjacent bit-line structures.

2. The memory device of claim 1, wherein the first void is closer to one of the adjacent bit-line structures than the other.

3. The memory device of claim 1, wherein recesses are formed in outer side surfaces of lower portions of the plurality of bit-line structures, the recesses laterally opening into gaps between adjacent bit-line structures, wherein each of the plurality of node contacts is formed between adjacent bit-line structures and fills the corresponding recesses.

4. The memory device of claim 3, wherein a portion of the node contact window extending into the substrate comprises a groove formed in the substrate, and lower boundaries of the corresponding recesses in the bit-line structures join boundaries of the groove, thus delimiting a first opening of a bit line contact window.

5. The memory device of claim 4, wherein the first void is formed in the first opening, and wherein the top of the first void is located between aligned portions of the corresponding recesses of the adjacent bit-line structures.

6. The memory device of claim 4, wherein trench isolation structures are further formed in the substrate, the trench isolation structures isolating adjacent active areas, the node contact windows further exposing at least part of the trench isolation structures, and
   wherein the groove comprises a first groove and a second groove, the first groove formed in the corresponding trench isolation structure, the second groove formed in the corresponding active area, the second groove having a depth greater than a depth of the first groove.

7. The memory device of claim 3, wherein each of the plurality of bit-line structures comprises a bit line and a spacer, the bit line formed on the substrate and electrically connected to a corresponding one of the plurality of active areas, the spacer covering at least side surfaces of the bit line, and wherein the recesses in the bit-line structure laterally extend from respective outer side surfaces of the spacer toward the bit line and stop in the spacer.

8. The memory device of claim 1, wherein the at least one void comprises a second void, which has a top and a bottom both located between aligned portions of adjacent bit-line structures, and wherein the second void is situated at a middle location between the adjacent bit-line structures.

9. The memory device of claim 8, wherein the second void is located between aligned portions of the third conductive layers of the adjacent bit-line structures.

10. The memory device of claim 8, wherein the first void is located below the second void and has a maximum width greater than two times a maximum width of the second void.

11. The memory device of claim 8, wherein portions of the adjacent bit-line structures above a top surface of the substrate delimit therebetween a second opening of the bit line contact window, and the second void is formed in the second opening.

12. The memory device of claim 1, wherein the plurality of bit-line structures extend in a predetermined direction and intersect the respective active areas, wherein portions of the plurality of bit-line structures that intersect the respective active areas form bit line contacts which are embedded in the substrate and electrically connected to the respective active areas, and wherein the bit line contacts extend in the substrate to a depth greater than a depth that the plurality of node contacts extend in the substrate.

13. A memory device, comprising:
a substrate in which a plurality of active areas are formed;
a plurality of bit-line structures formed on the substrate, adjacent bit-line structures defining therebetween node contact windows, each of the node contact windows having a lower portion extending into the substrate and exposing at least part of a corresponding one of the plurality of active areas; and
a plurality of node contacts filled in the respective node contact windows and electrically connected to the plurality of active areas, at least one of the plurality of node contacts having at least two voids formed therein;

wherein the at least two voids comprise a first void and a second void, and wherein the first void is located below the second void and has a maximum width greater than two times a maximum width of the second void.

14. The memory device of claim 13, wherein the first void is not aligned with the second void.

15. The memory device of claim 13, wherein each of the at least two voids has a top not lower than a bottom of any adjacent one of the plurality of bit-line structures.

16. The memory device of claim 13, wherein each of the at least two voids has a top and a bottom both located between aligned portions of adjacent bit-line structures, and wherein the at least two voids are situated at a middle location between the adjacent bit-line structures.

17. A memory device, comprising:
a substrate in which a plurality of active areas are formed;
a plurality of bit-line structures formed on the substrate, adjacent bit-line structures defining therebetween node contact windows, each of the node contact windows having a lower portion extending into the substrate and exposing at least part of a corresponding one of the plurality of active areas; and
a plurality of node contacts filled in the respective node contact windows and electrically connected to the plurality of active areas, wherein at least one void is formed in the plurality of node contacts,
wherein the at least one void comprises a first void, at least a top of the first void being located between aligned portions of adjacent bit-line structures, wherein the first void is closer to one of the adjacent bit-line structures than the other;
wherein recesses are formed in outer side surfaces of lower portions of the plurality of bit-line structures, the recesses laterally opening into gaps between adjacent bit-line structures, wherein each of the plurality of node contacts is formed between adjacent bit-line structures and fills the corresponding recesses.

* * * * *